United States Patent
Sommers et al.

(10) Patent No.: US 8,894,443 B2
(45) Date of Patent: *Nov. 25, 2014

(54) METHOD OF MOUNTING A CONNECTOR

(71) Applicant: Molex Incorporated, Lisle, IL (US)

(72) Inventors: Scott D. Sommers, Naperville, IL (US);
Kent E. Regnier, Lombard, IL (US);
Michael R. Kamarauskas, Bartlett, IL (US); Emanuel G. Banakis, Naperville, IL (US); Galen F. Fromm, North Aurora, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/946,267

(22) Filed: Jul. 19, 2013

(65) Prior Publication Data

US 2014/0020246 A1    Jan. 23, 2014

Related U.S. Application Data

(63) Continuation of application No. 12/919,259, filed as application No. PCT/IB2009/005418 on Feb. 26, 2009, now Pat. No. 8,506,332.

(60) Provisional application No. 61/031,574, filed on Feb. 26, 2008.

(51) Int. Cl.
*H01R 13/648* (2006.01)
*H01R 12/72* (2011.01)
*H01R 12/70* (2011.01)
*H05K 3/00* (2006.01)
*H01R 12/50* (2011.01)
*H01R 12/57* (2011.01)

(52) U.S. Cl.
CPC ............... *H05K 3/00* (2013.01); *H01R 12/725* (2013.01); *H01R 23/6873* (2013.01); *H01R 12/707* (2013.01); *H01R 12/57* (2013.01)
USPC ............... 439/607.34; 439/607.32; 439/607.4

(58) Field of Classification Search
CPC ..................... H01R 23/6873; H01R 23/7073
USPC ............... 439/607.34, 607.4, 607.32, 607.07, 439/607.35
See application file for complete search history.

(56) References Cited

U.S. PATENT DOCUMENTS 4,824,383 A    4/1989    Lemke
5,630,730 A    5/1997    Wang et al.
(Continued)

FOREIGN PATENT DOCUMENTS

EP    0 674 365 A2    9/1995
JP    64-41975 U    3/1989
(Continued)

OTHER PUBLICATIONS

International Search Report for PCT/IB2009/005418.

*Primary Examiner* — Hae Moon Hyeon
(74) *Attorney, Agent, or Firm* — Stephen L. Sheldon

(57) ABSTRACT

A board-mountable connector is provided. The connector includes a shield and an insulative housing with a tongue. Terminals are supported by the housing in two rows and the rows extend from a mating interface to a board mounting interface. The terminals may be mounted to the board via surface mount technology in two rows that are at about 0.4 mm pitch. The two rows of terminals are configured in a signal, signal, ground triangular configuration so as to provide a triangular terminal arrangement that extends from the mating interface to the mounting interface.

6 Claims, 10 Drawing Sheets

(56) References Cited

U.S. PATENT DOCUMENTS

| | | |
|---|---|---|
| 6,280,209 B1 | 8/2001 | Bassler et al. |
| 6,350,134 B1 | 2/2002 | Fogg et al. |
| 6,863,549 B2 | 3/2005 | Brunker et al. |
| 6,935,870 B2 | 8/2005 | Kato et al. |
| 7,108,552 B2 | 9/2006 | Niitsu et al. |
| 7,270,570 B1 | 9/2007 | Hamner et al. |
| 7,344,412 B2 | 3/2008 | Sato |
| 7,448,884 B2 | 11/2008 | Kato et al. |
| 7,462,059 B2 | 12/2008 | Saito et al. |
| 7,674,118 B2 * | 3/2010 | He ............................. 439/108 |
| 7,824,220 B2 | 11/2010 | Chen |
| 8,142,207 B1 * | 3/2012 | Ljubijankic et al. ............ 439/95 |
| 8,506,332 B2 * | 8/2013 | Sommers et al. ........ 439/607.34 |
| 2007/0197064 A1 | 8/2007 | Masumoto et al. |
| 2011/0034079 A1 * | 2/2011 | Nagata et al. ............ 439/607.01 |

FOREIGN PATENT DOCUMENTS

| | | |
|---|---|---|
| JP | 03 20875 U | 2/1991 |
| JP | 03-020875 U | 2/1991 |
| JP | 05-020269 U | 3/1993 |
| JP | 06-176808 | 6/1994 |
| JP | 2002-334748 | 11/2002 |
| JP | 2004-534358 A | 11/2004 |
| JP | 2007-115707 A | 5/2007 |
| JP | 3134262 U | 7/2007 |
| JP | 2007-305494 | 11/2007 |
| WO | WO 02/101883 A2 | 12/2002 |
| WO | WO 2006/047292 A1 | 5/2006 |

* cited by examiner

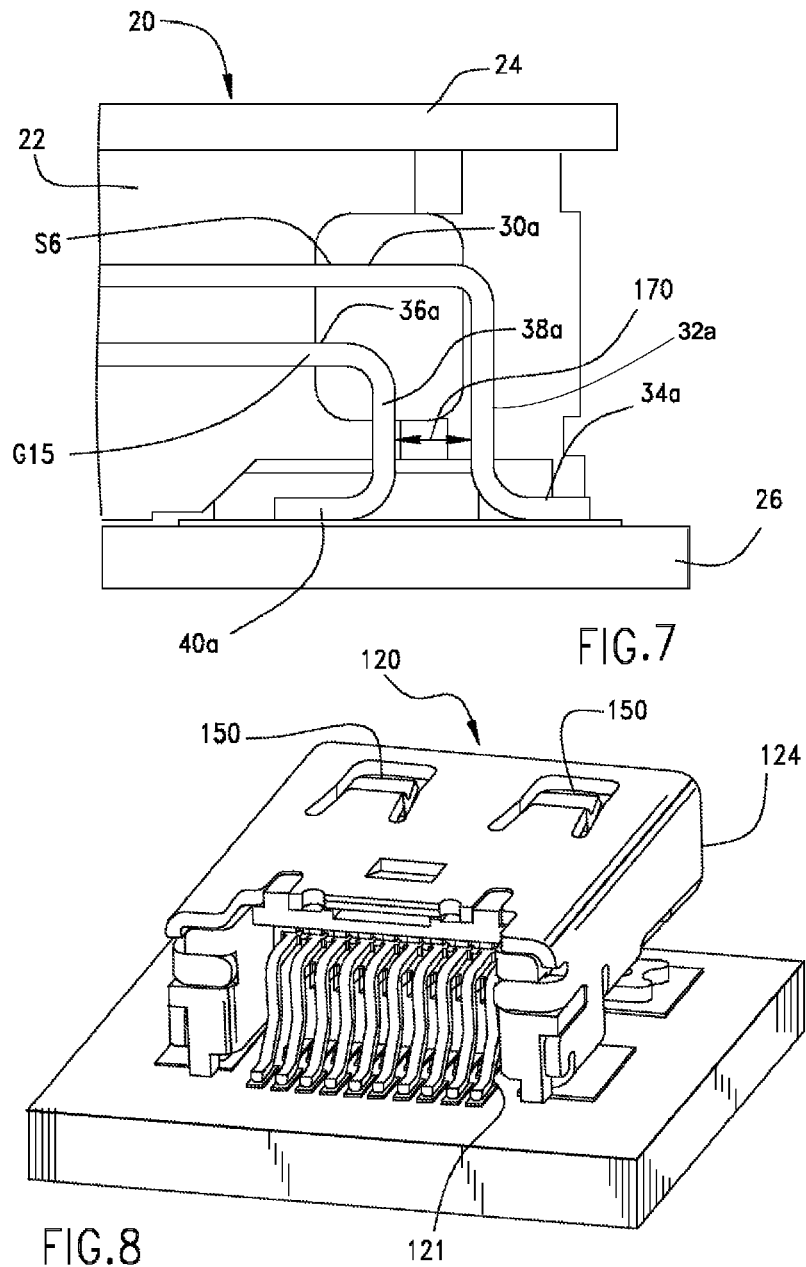

METHOD OF MOUNTING A CONNECTOR

RELATED APPLICATIONS

This application is a continuation of U.S. application Ser. No. 12/919,259, filed Aug. 24, 2010, now U.S. Pat. No. 8,506,322, which is a national phase of and claims priority to PCT Application No. PCT/IB2009/005418, filed Feb. 26, 2009, which in turn claims priority to U.S. Provisional Application No. 61/031,574, filed Feb. 26, 2008, all of which are incorporated herein by reference in their entirety.

BACKGROUND OF THE INVENTION

1. Field of the Invention

The present invention relates to a board mounted electrical connector, more specifically to a board mounted electrical connector which has particular applicability for a 0.4 mm pitch connector in a High-Definition Multimedia Interface (HDMI).

2. Description of Related Art

As is known, input/output (I/O) connectors face competing demands. On the one hand, there is a common desire to provide more dense packing of terminals. On the other hand, there is an increasing desire for the data channels in the I/O connector to function at higher frequencies. These competing desires make it challenging to optimize a connector.

While the general desires are challenging, certain configurations of connectors need to be particularly dense because they are intended to be very small. When the density is reduced below 0.7 mm pitch, for example, the design of the connector becomes challenging and as the pitch is reduced below 0.6 mm, certain methods of mounting the connector (such as the use of thru-holes) becomes more difficult because the vias cannot be positioned close enough. Thus, for very small pitch connectors such as connectors with a 0.4 mm pitch between terminals, surface mount technology (SMT) basically becomes required. Even with SMT, however, it is difficult to provide a desirable signal transmission between the mating interface and the mounting interface because the proximity of the terminals makes it easy for energy moving through terminals to negatively affect the signals on other terminals (e.g., introduce unwanted noise). Therefore, improvements in the design of connectors suitable for small pitches, such as a 0.4 mm pitch, would be appreciated.

BRIEF SUMMARY OF THE INVENTION

A board mounted connector is provided and includes a mating interface and a board mounting interface. Terminals are supported in the connector and extend from mating interface to the mounting interface. The terminals include contact portions that are positioned on opposite sides of an insulator in the mating interface so as to form a triangular terminal arrangement in a mating interface, the triangular terminal arrangement forming a triangle of two signal contacts making up a base and one ground contact forming the apex of the triangle. The terminals include body portions that extend from the contact portion to tail portions. The tail portions are configured to be attached to the board via surface mount technology. The tails are positioned in a first row and a second row, the tails in each row having a pitch of about 0.4 mm. The terminals in the first row may be offset in position from the terminals in the second row by about 0.2 mm. The triangular terminal arrangement continues from the mating interface to the mounting interface so as to continue the triangular terminal arrangement through the entire body of the connector.

BRIEF DESCRIPTION OF THE DRAWINGS

The present invention is illustrated by way of example and not limited in the accompanying figures in which like reference numerals indicate similar elements and in which:

FIG. 7 illustrates a cross-sectional view of the connector depicted in FIG. 6.

FIG. 8 illustrates a perspective view of an alternative embodiment of a board-mounted connector that includes terminals in a triad arrangement.

DETAILED DESCRIPTION OF THE INVENTION

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity.

Figure 1:
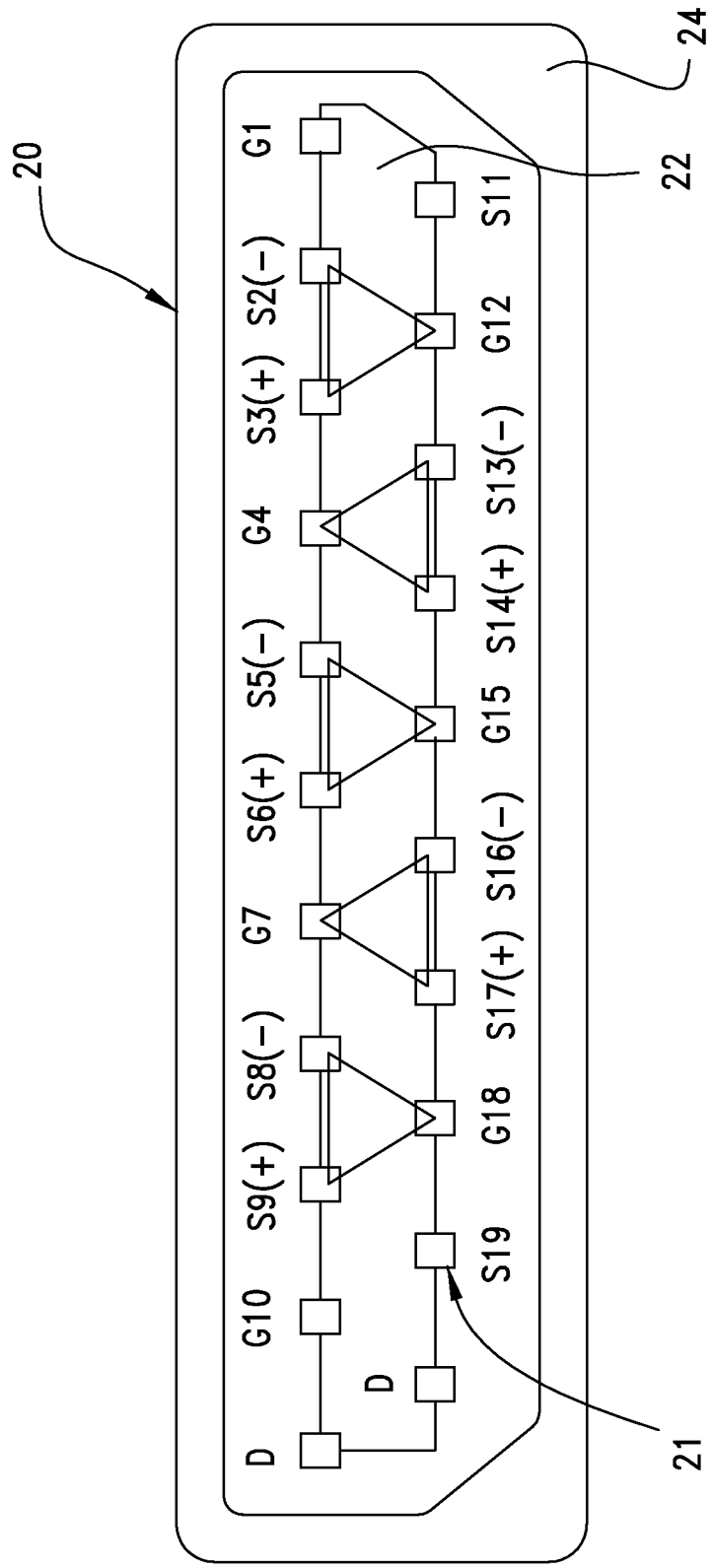
FIG. 1 illustrates an embodiment of a connector interface.
Figure 2A:
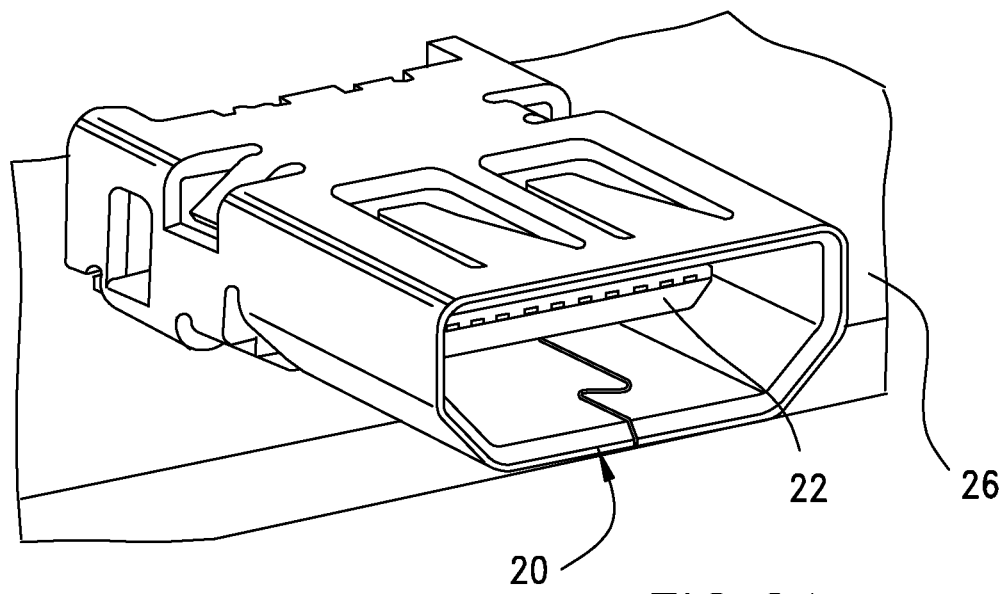
FIG. 2A illustrates an embodiment of a board-mounted connector.
Figure 2B:
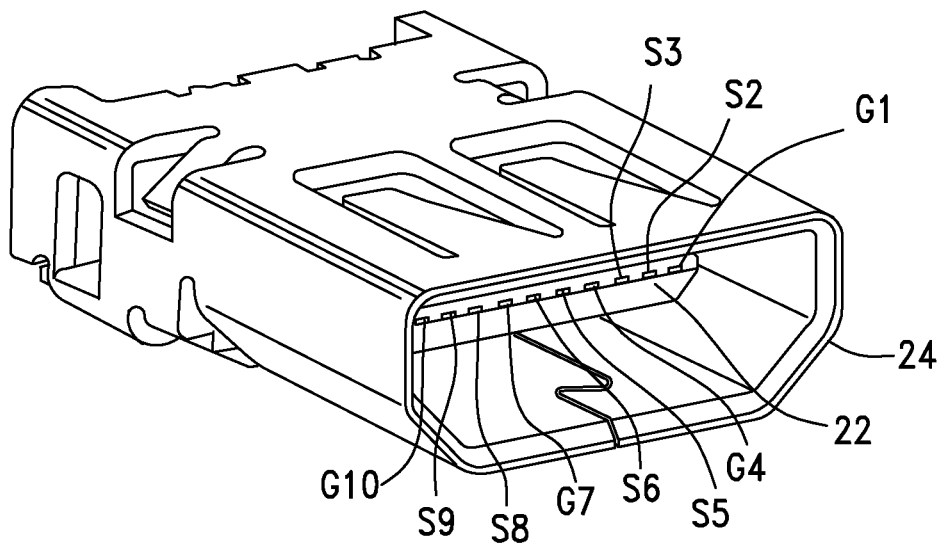
FIG. 2B illustrates the connector of FIG. 2 with the board removed for purposes of illustration.

FIGS. 1 and 2-2A illustrate features of a board mounted electrical connector 20. FIG. 1 illustrates a schematic representation of terminals 21 mounted on an insulator 22. As can be appreciated, ground and signal terminals form a triad or triangular shape on the insulator. As depicted, the triangle may include a base formed by two signal terminals (such as the depicted S2 and S3) in conjunction with ground terminal G12 (at the apex of the triangle). It should be noted that the depicted triangular relationships are merely illustrative and are not intended to be limiting unless otherwise noted. For example, in an embodiment a first triangular relationship could be between G1, S2 and S11. A second triangular relationship could be between G12, S3 and S13. Thus, while a number of triangular relationships are possible, the basic nature of a triangular relationship (e.g., two signals contacts forming a base of a triangle with the ground forming the apex of the triangle) can be maintained.

FIG. 2 show a perspective front view of a board mounted electrical connector 20 with FIG. 2A removing the board. As can be appreciated, the connector 20 is configured for surface mount technology (SMT) mounting to the board 26. It should be noted that when very small pitches are used, a thru-hole design is unable to be used (because the vias cannot be spaced so closely). Therefore, for smaller pitches such as 0.4 mm, attachment via SMT is required. Thus, configurations that are suitable for small pitch SMT configurations are not applicable to thru-hole designs.

Figure 3:
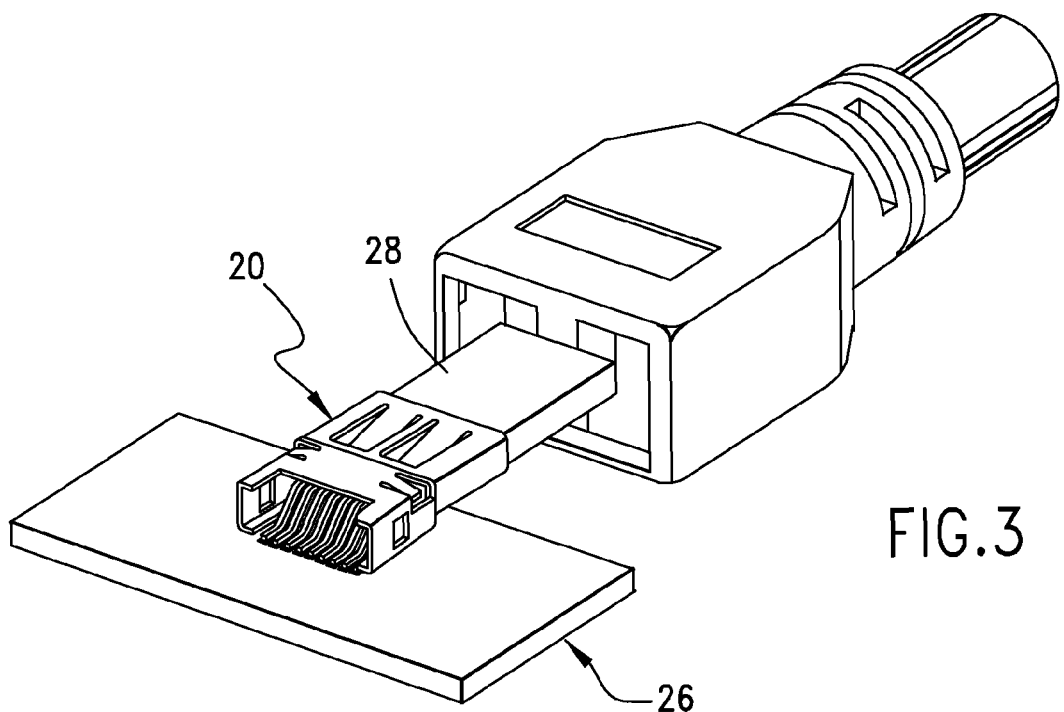
FIG. 3 illustrates an embodiment of a partially exploded plug connector mating with an embodiment of a board-mounted connector.

As shown in FIG. 3, the board mounted electrical connector 20 mates between a board 26 and a mating plug connector 28 (which is shown in partially exploded form with the mating portion of mating plug partially out of the connector for purposes of illustration). The connector 20 includes a plurality of terminals that provide spaced apart signal contacts portions S, return reference contact portions G, which in the preferred embodiment are ground contact portions, and power contact portions D, an insulator 22 holding the signal contact portions S, the return reference contact portions G, and the power contact portions D, and a receptacle shell 24 surrounding all of these components. Each pair of the signal contact portions S adjacent to each other includes a + signal contact and a − signal contact, thereby defining a differential signal transmission line. The mating plug connector is configured to interface with the signal contacts and includes terminals that mate with the contact portions.

The terminals of the above-mentioned three types (signal, return reference, and power) are disposed in a specific arrangement. In an embodiment, a first (e.g., upper) row may include the signal and return reference contact portions S, G so as to provide a guarded ground arrangement such that the signal and return reference contacts S, G are arranged in the order of G, S, S, G, S, S, G, S, S, G from the right side. Thus, the signals correspond to FIG. 1 in that the first contact is G1 and the last contact is D (which is used for power transmission). In a second (e.g., lower) row, the terminals may be arranged in the order of S, G, S, S, G, S, S, G, S (and D) from the right side. It should be noted, however, that the pin layout (the determination of what is a ground or signal terminal, for example) is not intended to be limiting as person of skill in the art will appreciate that other pin layouts are possible. Depending on the needs of the connector system, certain signal terminals S may be used for low speed signals. For convenience in explaining the routing of the terminals, the terminals are numbered from 1 to 19 (with the two D terminals being 20 and 21), along with an S or a G to denote the potential use for the terminal. As can be appreciated, some other number of terminals may be provided. The power terminals may also be provided in the rows, and in an embodiment may be provided at one of the ends. The signal terminals S+, S− adjacent to each other in the first row and the return reference terminal G in the second row are located at three apexes of an isosceles triangle as shown by the line (it is to be understood that line does not represent an electrical connection and merely shows the isosceles triangle formation). Likewise the return reference terminal G in the first row and the signal terminals S+, S− adjacent to each other in the second row are located at three apexes of an isosceles triangle. At the other end of the receptacle shell 24, the tails of the terminals S, G may be positioned in two rows as shown, for example, in FIGS. 4 and 6.

Figure 4:
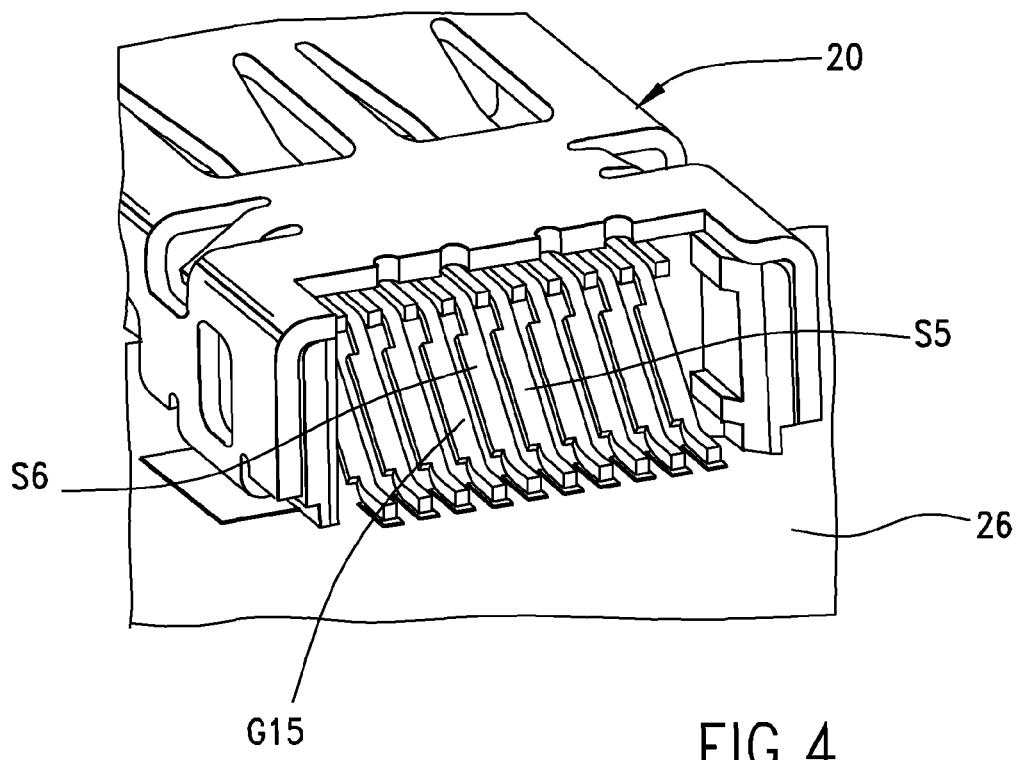
FIG. 4 illustrates an embodiment of a board-mounted connector that includes terminals in a triad arrangement.
Figure 5:
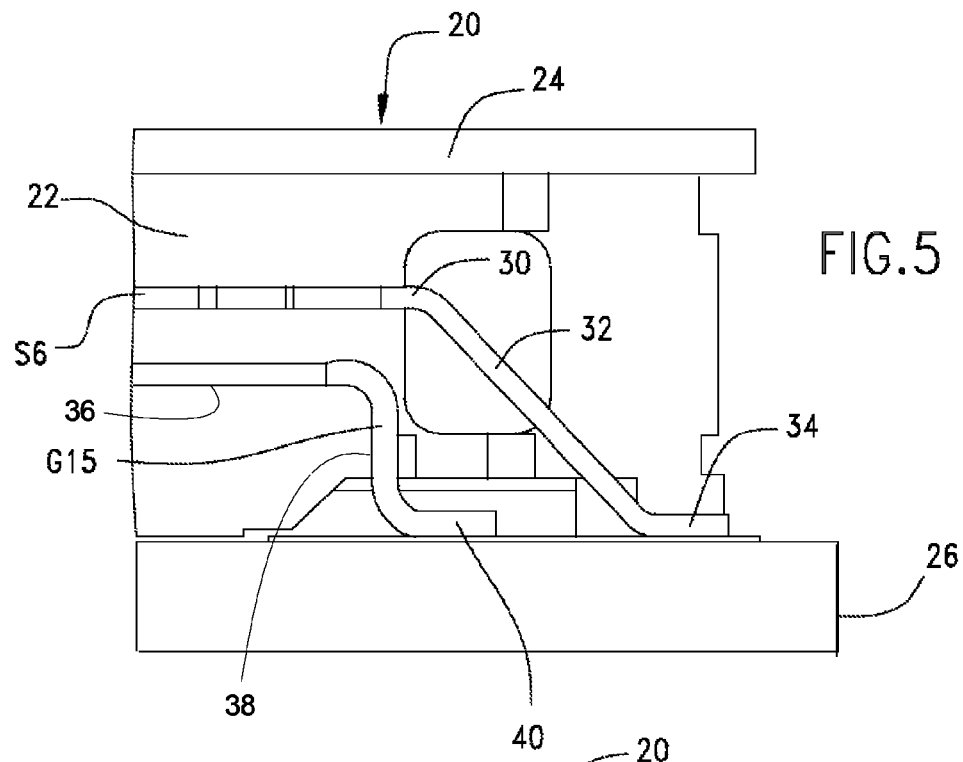
FIG. 5 illustrates a cross-sectional view of the connector depicted in FIG. 4.

A first embodiment of the body routing is shown in FIGS. 4 and 5. Terminal S5 and S6 are positioned in the first row and terminal G15 is positioned in the second row so to form the triangular relationship between the terminals that extends from the mating interface to the board interface. Bodies of the first row of terminals S, G extend outwardly from the insulator 22, are linearly aligned, and spaced apart from each other. The body of each terminal S, G in the first row has a first portion 30 which extends outwardly from the insulator 22 in a direction generally parallel to the board 26 to which the connector 20 is 20 mounted and a second portion 32 which extends at an angle relative to the first portion 30 downwardly toward the board 26. The terminal further includes a tail portion 34 which extends outwardly from the second portion 32 in a direction away from the connector 20. The tail portion 34 of each terminal S, G in the first row is soldered to the board 26. As depicted, the tails in the first row are soldered at a 0.4 mm pitch. The second portion 32 is angled at 45 degrees relative to the first portion 30, and the second portion 32 is angled at 45 degrees relative to the tail portion 34 to help control impedance. Bodies of the second row of terminals S, G extend outwardly from the insulator 22, are linearly aligned, and spaced apart from each other. The body of each terminal S, G in the second row has a first portion 36 which extends outwardly from the insulator 22 in a direction generally parallel to the board 26 to which the connector 20 is mounted and a second portion 38 which is generally perpendicular to the first portion 36 and extends downwardly toward the board 26. The terminal further includes a tail portion 40 which extends generally perpendicular to the second portion 38 in a direction away from the connector 20. The tail portion 40 of each terminal S, G in the second row is soldered to the board 26 and may also be at a pitch of 0.4 mm. The ends of the tail portions 40 are spaced from the respective tail portions 34 but extend in the same direction (away from the mating interface of the connector).

As can be appreciated, the width of second portions 32 brings the terminals very close together and the width can be increased to reduce the spacing between adjacent terminals S, G in the top row so as to modify an impedance of the terminals. If, as generally depicted, the terminals in the first and second row are offset by 0.2 mm, the width of the terminals can be configured to be about 0.2 mm near/at the tail portion (potentially reducing the width from between 0.3 and 0.4 mm at the widest point of the terminal body) so the solder joints can be inspected.

Figure 6:
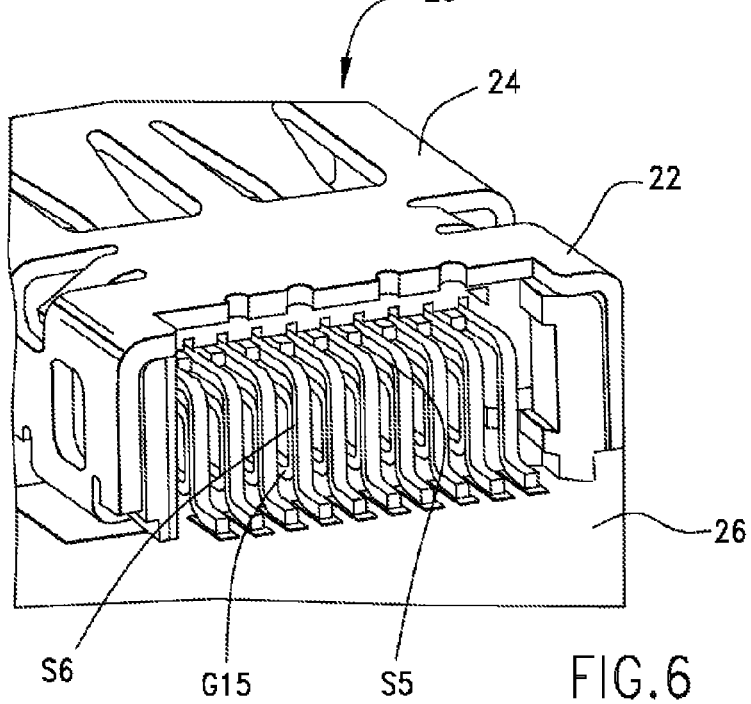
FIG. 6 illustrates another embodiment of a board-mounted connector that includes terminals in a triad arrangement.
Figure 9:
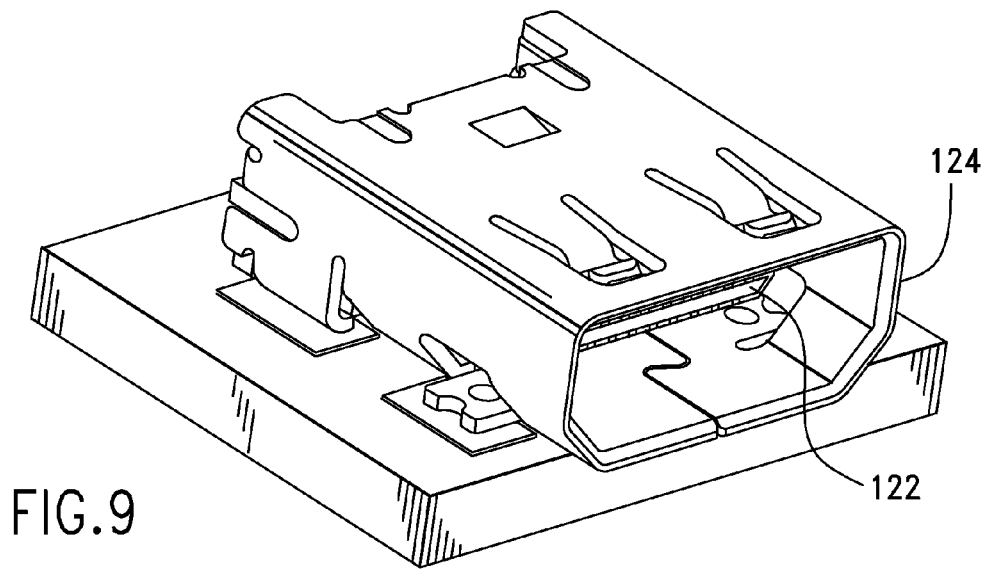
FIG. 9 illustrates another perspective view of the connector depicted in FIG. 8.

A second embodiment is shown in FIGS. 6 and 7. Bodies of the first row of terminals S, G extend outwardly from the insulator 22, are linearly aligned, and spaced apart from each other. The body of each terminal S, G in the first row has a first portion 30a which extends outwardly from the insulator 22 in a direction generally parallel to the board 26 to which the connector 20 is mounted and a second portion 32a which is generally perpendicular to the first portion 30a (e.g., is a vertical portion) and extends downwardly toward the board 26. The terminal further includes a tail portion 34a which extends generally perpendicular to the second portion 32a in a direction away from the connector 20. The tail portion 34a of each terminal S, G in the first row is soldered to the board 26.

Bodies of the second 20 row of terminals S, G extend outwardly from the insulator 22, are linearly aligned, and spaced apart from each other. The body of each terminal S, G in the second row has a first portion 36a which extends outwardly from the insulator 22 in a direction generally parallel to the board 26 to which the connector 20 is mounted and a second portion 38a which is generally perpendicular to the first portion 36a (e.g., is a vertical portion) and extends downwardly toward the board 26. The terminals in the second row further include a tail portion 40a which extends generally perpendicular to the second portion 38a in a direction toward the connector 20 mating interface. The tail portion 40a of each terminal S, G in the second row is soldered to the board 26.

In each embodiment, the terminals S, G are formed so as to allow for impedance tuning and a horizontal distance along a first direction (as illustrated in FIG. 7) between vertical portions 32a, 38a can be modified to control the impedance by varying the lengths of the first portions 30a, 36a. As can be appreciated, the first direction is substantially parallel with the first portion of the terminals. Similarly, looking back at FIGS. 4 and 5, the distance between second portions 32, 38 can be modified by adjusting the length of first portions 30, 36. In an embodiment, the distance between vertical second portions along the axis can be less than 0.6 mm. In another embodiment, the distance between vertical second portions can be about 0.4 mm. As can be appreciated, the signal terminals S can be brought closer to the return reference (or ground) terminals G by using these configurations. The use of the ground coupled to the pair of signal terminals S, if the relationship is substantially maintained throughout the connector, helps prevent energy in a common mode from causing additional noise in the signal pair, and thus helps to reduce unwanted noise. The ground terminals can also help shield adjacent pairs of signal terminals, thus helping to reduce cross-talk.

In a third embodiment, as depicted in FIGS. 8-19, terminals can be similarly mounted to a board via SMT in a manner that allows a triangular terminal (TT) arrangement to extend from the contact interface to the board mounting interface.

As depicted, connector 120 includes shield 124 with contacts 150 and terminals 121 mounted via SMT to a circuit board. An insulative housing 122 includes a tongue 122a that is positioned in the shield so as to provide a mating interface. Terminals 121 (which are individually labeled T1-T19) are positioned in two rows on the tongue 122a and the two rows extend through the connector from the mating interface to a board mounting interface. The terminals can provide three or more triangular terminal arrangements that each have two signal terminals and one ground terminal and are suitable for higher-speed data transmission.

The body of the terminals in the first row includes a first portion 130 that is supported by the housing and extends in a first direction and a second portion 132 that extends in a second direction substantially perpendicular to the first direction (e.g., a vertical portion). The body of the terminal in the first row further includes a tail portion 134 and a angled portion 133 coupling the tail portion 134 to the second portion 132. The tail portions 134 may be configured to be at a 0.4 mm pitch.

The body of the terminals in the second row includes a first portion 136 that is supported by the housing and extends in the first direction and a second portion 138 that extends in the second direction substantially perpendicular to the first direction (e.g., a vertical portion). The body of the terminal in the second row further includes a tail portion 140. The tail portions 140 may be configured to be at a 0.4 mm pitch but may be offset transversely from the tail portions 134 by 0.2 mm so that they can be readily visually inspected from a side of the connector that is opposite a side of the connector that includes the mating interface.

As can be appreciated, the vertical portions are separated along the first direction by a distance 170 and the distance will have an affect on the coupling between terminals in different rows. If it is desirable to increase the coupling between terminals in the first and second row, the distance 170 can be reduced and in an embodiment can be less than 0.6 mm. In another embodiment, the distance 170 can be about 0.4 mm. However, as can be appreciated, the benefit of the configuration illustrated in FIGS. 4 and 5 is that the distance 170 can be maintained closer to the board, thus helping to ensure consistent coupling between terminals in the first and second row. The configuration depicted in FIGS. 15-17, however, can be adjusted so that the distance 170 is about 1 mm or less along the length of the second portion 138.

Figure 18:
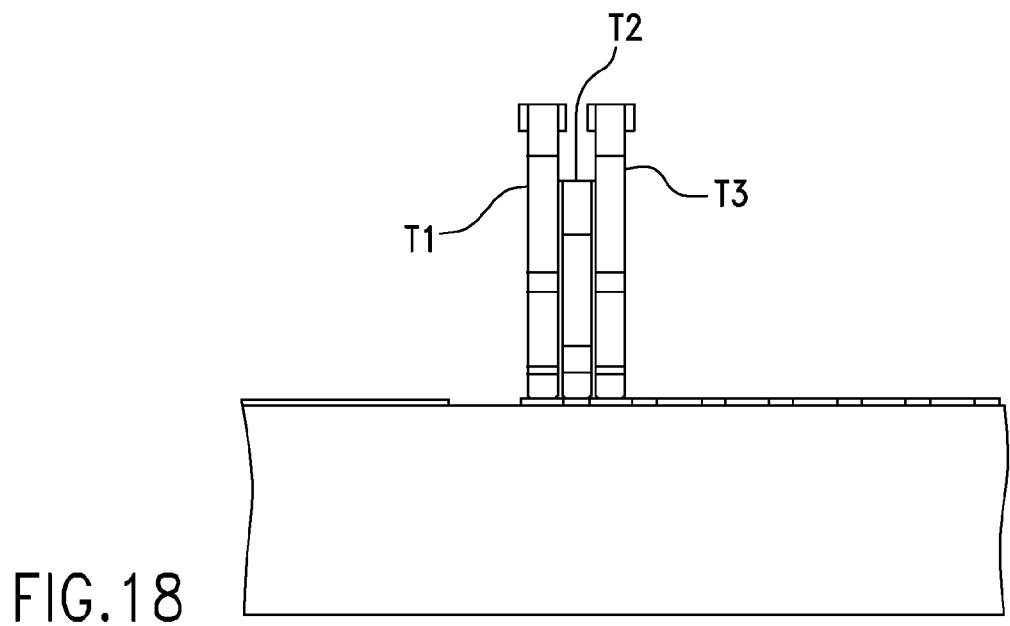
FIG. 18 illustrates a partial elevated rear view of the terminals depicted in FIG. 16.
Figure 19:
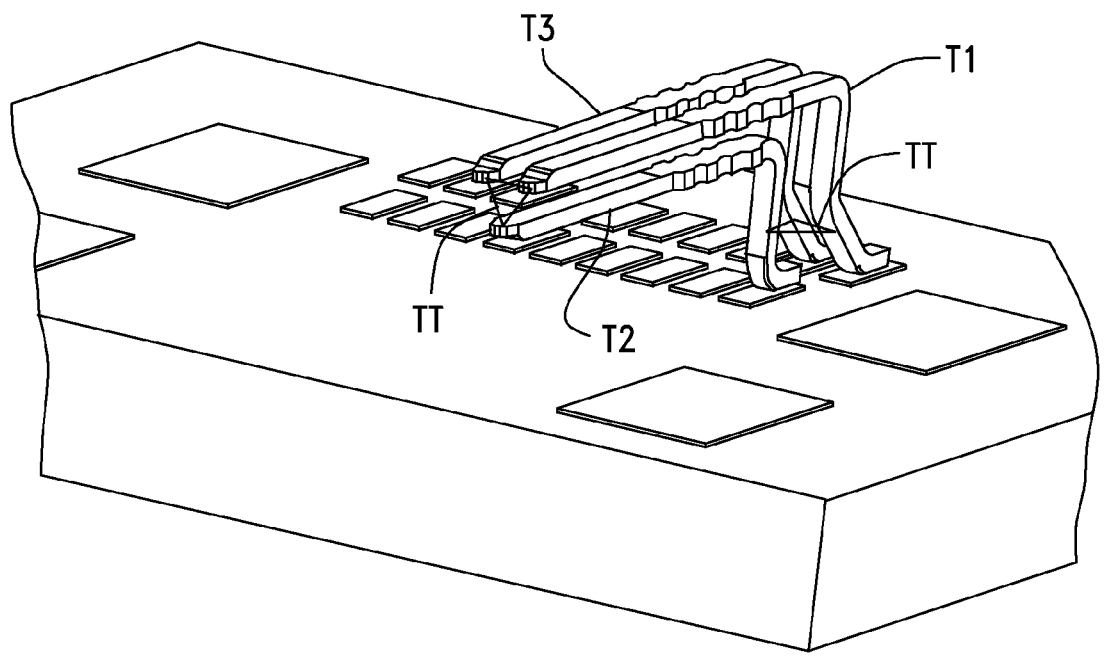
FIG. 19 illustrates a perspective view of the terminals depicted in FIG. 18 so as to illustrate the triangular relationship between the terminals.

As can be appreciated from FIGS. 18-19, which only shows three terminals for each of comprehension, terminals T1-T3 form a triangular terminal (TT) arrangement that extends from the mating interface to the board mounting interface. This allows the coupling between the two signal terminals and the ground terminal to be maintained in a more consistent manner. It should be noted that while T1 and T3 are in one row of terminals and T2 is in a second row of terminals, any of terminals T1, T2 and T3 may be the ground terminal. In an embodiment, if the ground terminal of a first TT is in the first row of terminals, then the ground terminal of a second adjacent TT may be in the second row of terminals.

Figure 10:
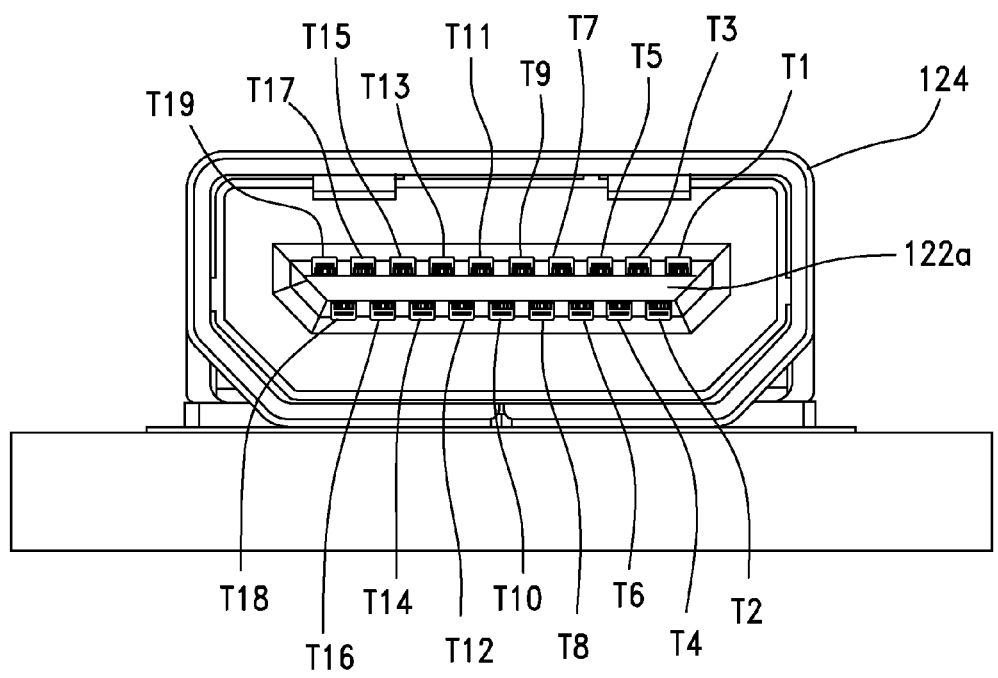
FIG. 10 illustrates an elevated front view of the connector depicted in FIG. 8.
Figure 11:
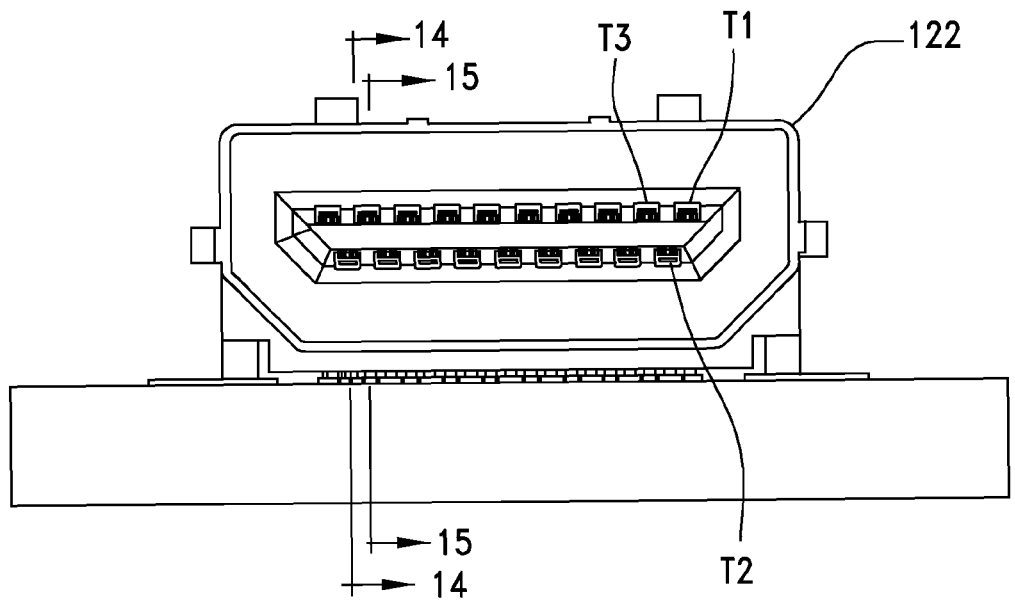
FIG. 11 illustrates the connector depicted in FIG. 10 with the shell removed for purposes of illustration.
Figure 12:
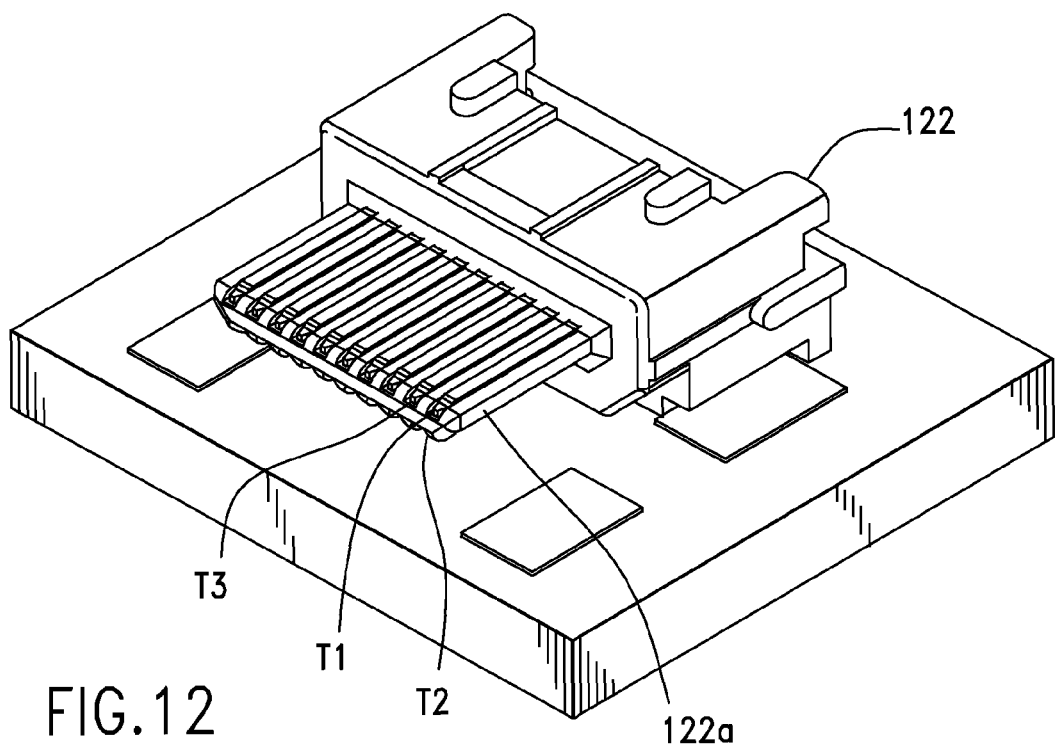
FIG. 12 illustrates a perspective view of the partial connector depicted in FIG. 11.
Figure 13:
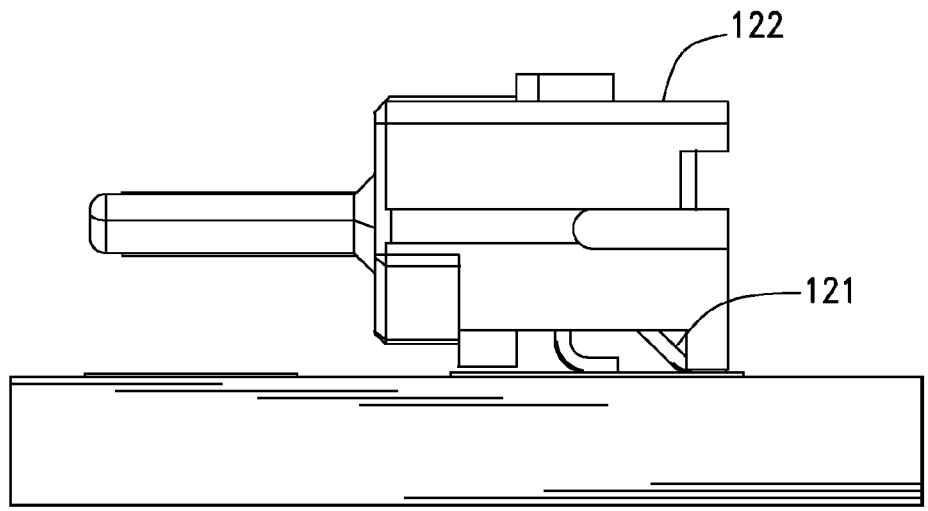
FIG. 13 illustrates an elevated side view of the partial connector depicted in FIG. 11.
Figure 14:
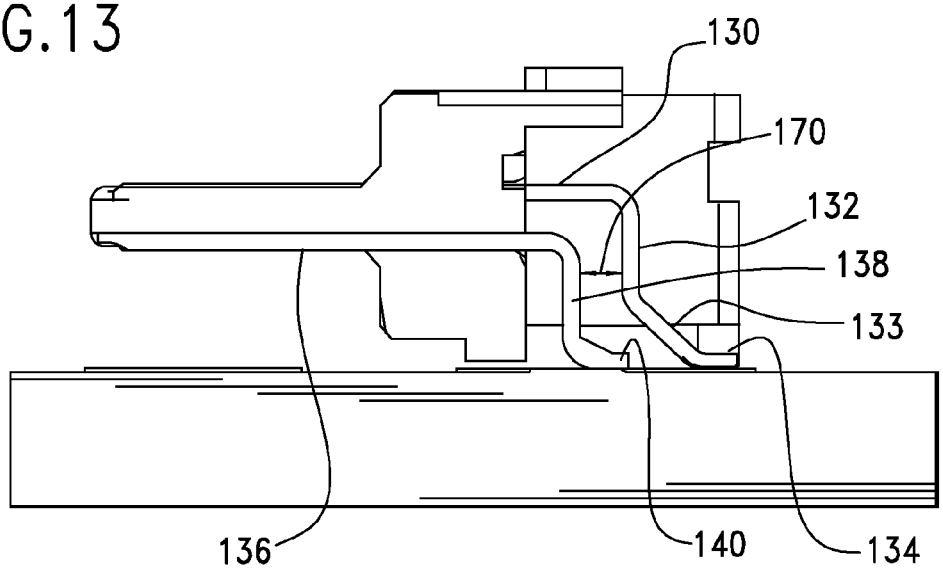
FIG. 14 illustrates a cross-section view of the partial connector depicted in FIG. 11 along line 14-14.
Figure 15:
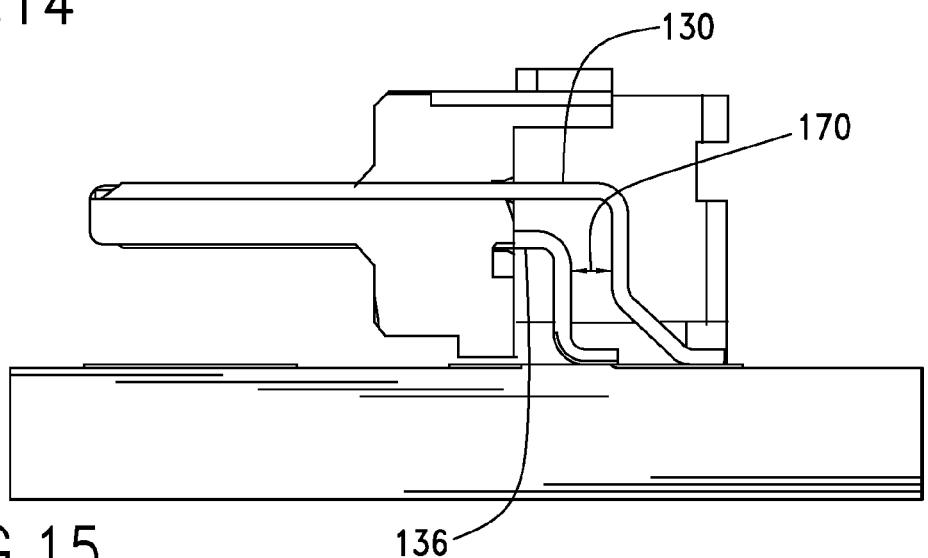
FIG. 15 illustrates a cross-section view of the partial connector depicted in FIG. 11 along line 15-15.
Figure 16:
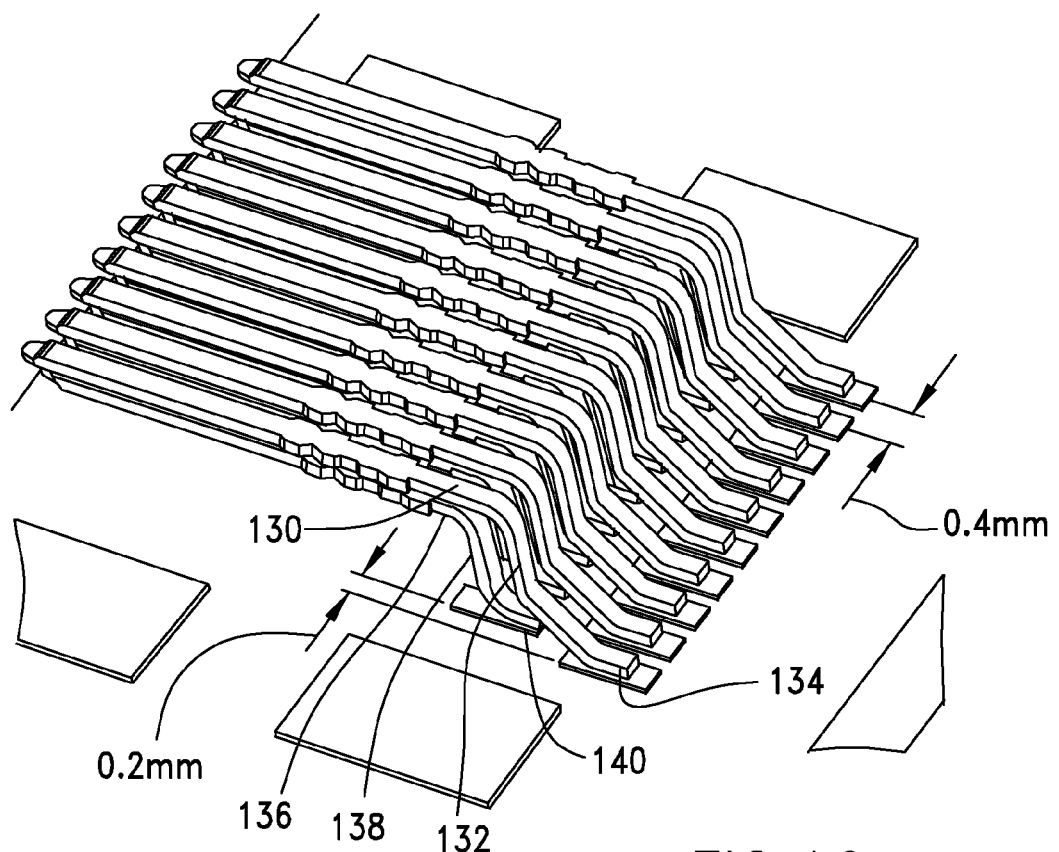
FIG. 16 illustrates a partial perspective enlarged view of the connector depicted in 11 with a housing removed.
Figure 17:
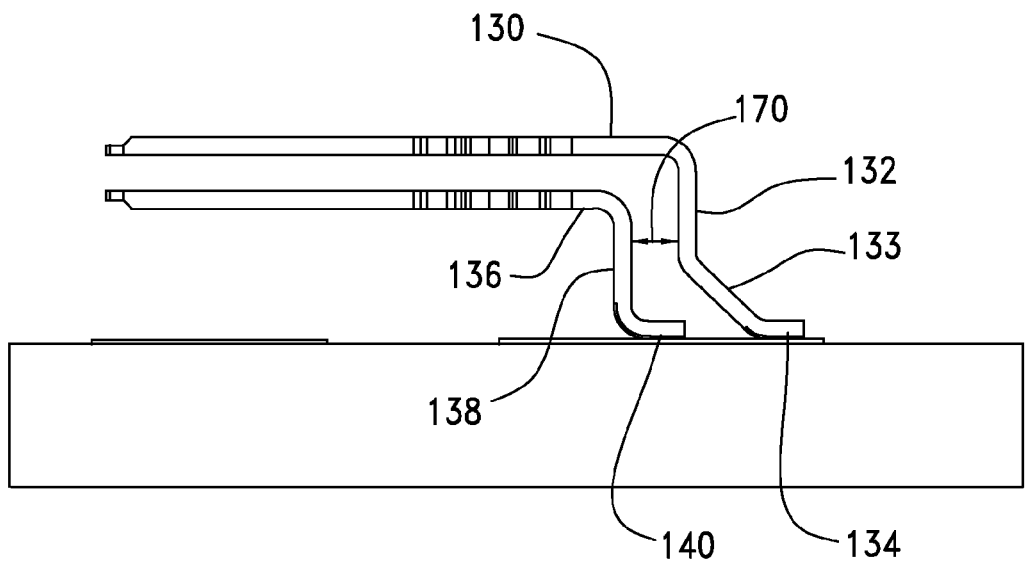
FIG. 17 illustrates an elevated side view of the terminals depicted in FIG. 16.

In an embodiment, referring back to the terminals illustrated in FIG. 10, the connector may be configured so that terminals T1-T3 form a signal, signal ground TT; terminals T4-T6 form a signal, signal, ground TT and terminals T7-T9 form a signal, signal, ground TT. If so configured, terminals T1, T4 and T7 may be ground terminals.

The present invention has been described in terms of preferred and exemplary embodiments thereof. Numerous other embodiments, modifications and variations within the scope and spirit of the appended claims will occur to persons of ordinary skill in the art from a review of this disclosure.

We claim:

1. A method of mounting a connector on a board, comprising:
providing a connector with a first and second triangular terminal arrangements, each arrangement including a first signal terminal, a second signal terminal and a ground terminal at a mating interface, one of the arrangements including two terminals positioned in a first row of terminals and one of the terminals positioned in a second row of terminals, the first and second row of terminals extending through the connector so that the triangular terminal arrangement is maintained from the mating interface to a mounting interface, the mounting interface including two rows of tails of the terminals, the tails being about 0.2 mm wide;
positioning the connector on a circuit board; and
reflowing solder so as to attach the two rows of tails to the circuit board via surface mount technology, wherein both of the two rows of tails are attached at a 0.4 mm pitch.

2. The method of claim 1, wherein one of the rows of tails is offset by 0.2 mm from the other row so that tails in one row are substantially positioned in the space between tails in the other row.

3. The method of claim 1, wherein the connector further includes a third triangular terminal arrangement that each extend from the mating interface to the board mounting interface, one of the second and the third terminal arrangements having two terminals positioned in the second row of terminals.

4. The method of claim 1, wherein the providing of the connector includes mounting the terminals in the connector by inserting the terminals in the housing in a direction toward the mating interface.

5. The method of claim 4, wherein the terminals are inserted so as to provide a spacing between the rows that is not more than about 1 mm.

6. The method of claim 1, wherein one of the two rows of tails extends toward the mating interface and the other row of tails extends away from the mating interface.

* * * * *